United States Patent [19]
Matsuda

[11] Patent Number: 5,750,997
[45] Date of Patent: May 12, 1998

[54] METHOD AND APPARATUS FOR OBSERVING WIRING PATTERNS OF PRINTED CIRCUIT BOARD

[75] Inventor: Shinji Matsuda, Kawasaki, Japan

[73] Assignee: Fujitsu Limited, Kanagawa, Japan

[21] Appl. No.: 597,247

[22] Filed: Feb. 6, 1996

[30] Foreign Application Priority Data

Feb. 14, 1995 [JP] Japan ................................ 7-025110

[51] Int. Cl.[6] .................................................. H05K 10/00
[52] U.S. Cl. .................................... 250/341.8; 250/341.1
[58] Field of Search .............................. 250/341.8, 341.1, 250/341.4; 382/147, 145

[56] References Cited

FOREIGN PATENT DOCUMENTS

3422395 C2  1/1985  Germany.
3519772 A1  12/1985  Germany.
3626061 C2  5/1987  Germany.
1025529  1/1989  Japan ................................ 382/145

OTHER PUBLICATIONS

Leah et al Certainty of Measurement Using an Automated IR laser Insection Instrument for PCB Solder Joint Integrity. J. Phys.E: Sci. Instrum. vol. 18, 1985, p. 676.

*Primary Examiner*—Michael J. Tokar
*Assistant Examiner*—Richard Hanig
*Attorney, Agent, or Firm*—Nikaido Marmelstein Murray & Oram LLP

[57] ABSTRACT

A method for observing wiring patterns of a printed circuit board includes the steps of projecting light having a wave length within an infrared range on the printed circuit board, detecting reflected light from the printed circuit board, and forming an image based on the reflected light, so that the wiring patterns of the printed circuit board is observed through the image.

12 Claims, 8 Drawing Sheets

METHOD AND APPARATUS FOR OBSERVING WIRING PATTERNS OF PRINTED CIRCUIT BOARD

BACKGROUND OF THE INVENTION (1) Field of the Invention

The present invention generally relates to a method and apparatus for observing wiring patterns of a printed circuit board, and more particularly to a method and apparatus which can observe wiring patterns in an internal layer of a multi-layer printed circuit board.

(2) Description of the Related Art

In recent years, printed circuit boards progress in multi-layering and fine structuring of wiring patterns. To change wiring patterns of a printed circuit board, it is important to detect accurate positions of the wiring patterns of the printed circuit board. Thus, a method and apparatus which can accurately discern wiring patterns of a multi-layer printed circuit board are required.

Conventionally, wiring patterns on a surface layer of a printed circuit board are directly observed or observed by used of a microscope or a visible-light camera. In a case where a printed circuit board includes materials, such as an insulating layer made of glass-epoxy resin and solder resist, which have a relatively high transmittance with respect to visible light, wiring patterns in an internal layer of the printed circuit board can be observed somehow but incompletely. However, in a printed circuit board having an insulating layer made of polyimide resin which has a low transmittance with respect to the visible light, it is not possible to observe wiring patterns in an internal layer of the printed circuit board by means of the visible light. Thus, a method for observing wiring patterns in an internal layer of the printed circuit board by means of X-ray has been proposed. In addition, a method for observing wiring patterns, which are heated, by means of an infrared camera has been proposed.

According to the method using the X-ray, an image in which wiring patterns 3 and 3 on upper and lower layers are formed in like manner is obtained, as shown in FIG. 1. Thus, wiring patterns 3 and 3 on the upper and lower layers can not be distinguished from each other on the image obtained by means of the X-ray. In addition, the X-ray may damage circuit elements, such as LSIs, mounted on the printed circuit board. Further, a production cost of an apparatus using the X-ray is high.

According to the method in which the wiring patterns are heated, terminals of circuit elements which can be heated are limited. Thus, it is hard to heat the wiring patterns in a state where circuit elements are actually mounted on the printed circuit board.

SUMMARY OF THE INVENTION

Accordingly, a general object of the present invention is to provide a novel and useful method and apparatus for observing wiring patterns of a printed circuit board in which the disadvantages of the aforementioned prior art are eliminated.

A specific object of the present invention is to provide a method which can simply and certainly observe wiring patterns in an internal layer of a printed circuit board.

The above objects of the present invention are achieved by a method for observing wiring patterns of a printed circuit board, said method comprising the steps of: (a) projecting light having a wave length within an infrared range on the printed circuit board; (b) detecting reflected light from the printed circuit board; and (c) forming an image based on the reflected light detected in said step (b), so that the wiring patterns of the printed circuit board is observed through the image.

Another object of the present invention is to provide an apparatus which can simply and certainly observe wiring patterns of an internal layer of a printed circuit board.

The above objects of the present invention are achieved by an apparatus for observing wiring patterns of a printed circuit board, said apparatus comprising: lighting means for projecting light having a wave length within an infrared range on the printed circuit board; detecting means for detecting reflected light from the printed circuit board; and image forming means for forming an image based on the reflected light detected by said detecting means, so that the wiring patterns of the printed circuit board is observed through the image.

According to the present invention, since general materials (e.g., glass-epoxy resin, the solder resist and the polyimide) of the printed circuit board have a relative high transmittance with respect to the light having the wave length in the infrared range, a fine image of wiring pattern in an internal layer of the printed circuit board on which the light is projected can be obtained. In addition, since the image of the wiring patterns is formed based on the reflected light from the internal layer of the printed circuit board, an upper wiring pattern and a lower wiring pattern can be distinguished from each other in the image.

BRIEF DESCRIPTION OF THE DRAWINGS

Other objects, features and advantages of the present invention will be apparent from the following detailed description when read in conjunction with the accompanying drawings, in which.

DESCRIPTION OF THE PREFERRED EMBODIMENTS

A description will now be given of an embodiment of the present invention.

Figure 1:
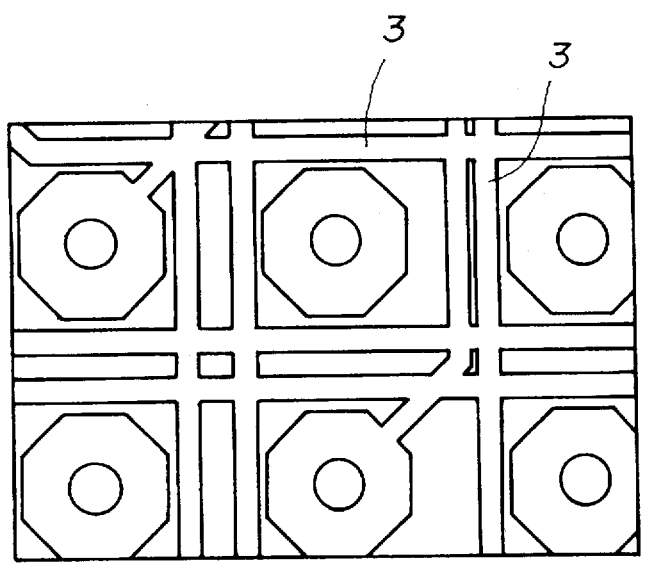
FIG. 1 is a diagram illustrating an image of wiring patterns of a printed circuit board which image is obtained by mean of the X-ray.
Figure 2:
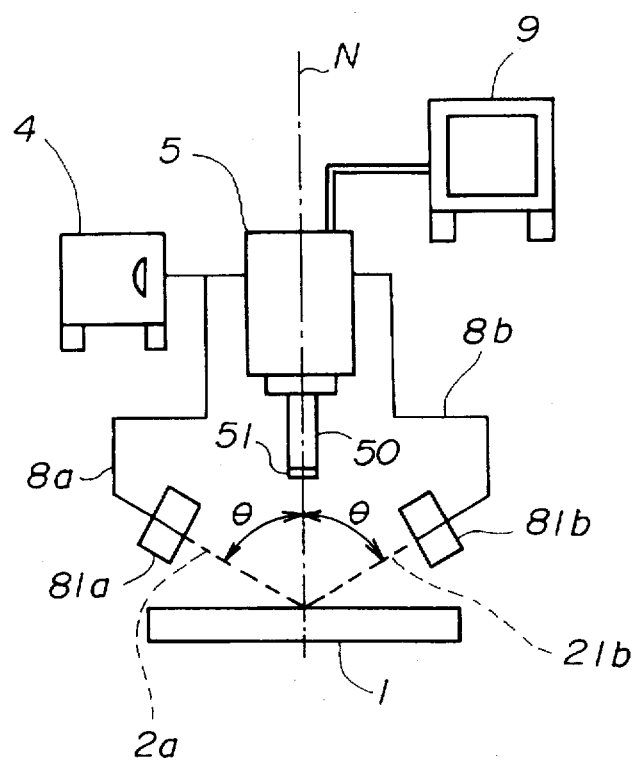
FIG. 2 is a diagram illustrating an apparatus, according to an embodiment of the present invention, for observing wiring patterns of a printed circuit board.

An apparatus for observing wiring patterns of a printed circuit board, according to an embodiment of the present invention, is formed as shown in FIG. 2. Referring to FIG. 2, the apparatus has a light source 4, a light detecting unit 5 and a display unit 9 (e.g., a CRT display unit). The light source 4 (including an infrared lamp) emits light having a wave length within an infrared range (700 nm– 3000 nm). Condenser lenses 81a and 81b are located over a printed circuit board 1 to be observed. The light emitted from the light source 4 is branched into first light 2a and second light 2b by optical fibers 8a and 8b. The first light 2a and the second light 2b respectively travel to the condenser lenses 81a and 81b through the optical fibers 8a and 8b and are converged on a point (a target point) on the printed circuit board 1 by the condenser lenses 81a and 81b. Both the first light 2a and the second light 2b are incident on the target point at an incident angle Θ. The incident angle Θ of each of the first light 2a and the second light 2b is defined by an angle between each of the first and second light 2a and 2b and the normal line (N) of the surface of the printed circuit board 1. The incident angle Θ is set at a predetermined angle.

Figure 4:
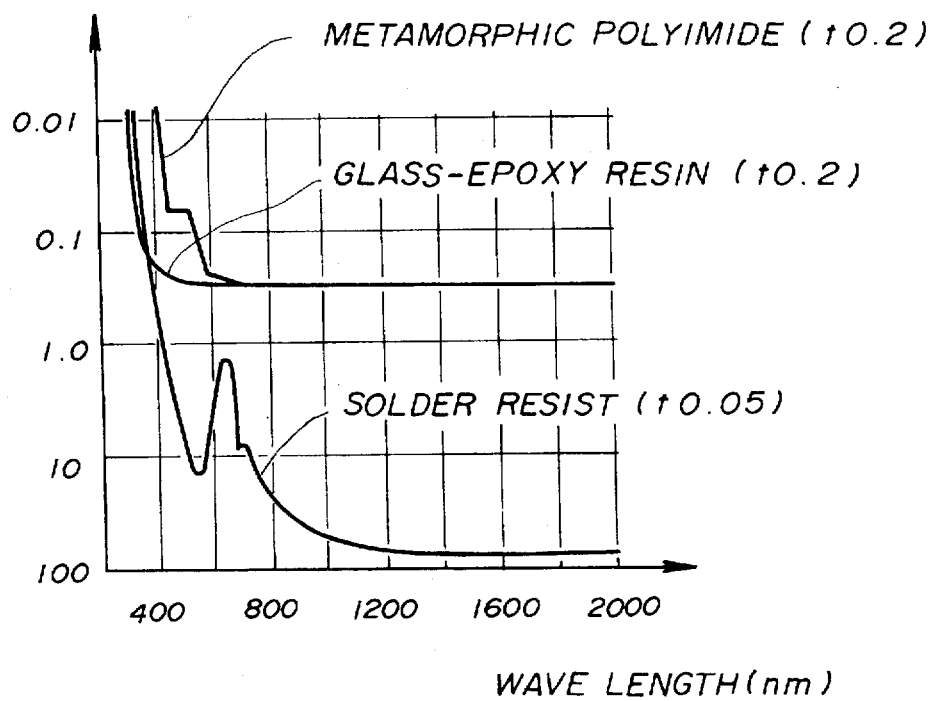
FIG. 4 is a diagram illustrating absorption characteristics of materials of printed circuit boards.

The absorption characteristics of materials of the printed circuit board 1 were experimentally obtained as shown in FIG. 4. The absorption characteristic of material is defined by a relationship between the transmittance and the wave length of light transmitted through the material. In general, polyimide, glass-epoxy and solder resist are used as material of insulating layers of the printed circuit board and as material of a base board of the printed board. The solder resist and the glass-epoxy resin have a relatively high transmittance with respect to the visible light. Further, the solder resist and the glass-epoxy resin have a relative high transmittance with respect to light having a wave length within the infrared range ($\geq 700$ nm) as shown in FIG. 4. In addition, the polyimide (metamorphic polyimide) has a relatively low transmittance with respect to the visible light, but has a relatively high transmittance with respect to the light having a wave length within the infrared range as shown in FIG. 4.

The materials of the printed circuit board 1 have the relatively high transmittance with respect to the light having a wave length within the infrared range as has been described above. Thus, the first and the second light 2a and 2b incident on the printed circuit board 1 can pass through an insulating layer made of polyimide with which an internal layer of the printed circuit board 1 is covered and can be reflected by wiring patterns in the internal layer. The light detecting unit 5 is located over the printed circuit board 1 so that an optical axis of the light detecting unit 5 and the normal line (N) which stands on the target point on the printed circuit board 1 correspond to each other. As a result, light reflected by wiring patterns on the surface of the printed circuit board 1 and light reflected by the wiring patterns in the internal layer of the printed circuit board 1 are incident on the light detecting unit 5. The light detecting unit 5 includes an infrared camera. A light guide device 50 and a filter 51 are provided with the light detecting unit 5. The filter 51 is mounted on an end of the light guide device 50. The light incident on the light detecting unit 5 is led to the infrared camera through the filter 51 and the light guide device 50. The filter 51 eliminates light components in an ultraviolet range and the visible light components from the light incident on the light detecting unit 5. As a result, interference between the light components in the infrared range and other light components including the light components in the ultraviolet range and the visible light components is reduced.

In the light detecting unit 5, output signals from the infrared camera which receives the reflected light from the printed circuit board 1 are processed in accordance with a known image processing method, so that image signals corresponding to the wiring patterns are formed. The image signals are supplied to the display unit 9. The display unit 9 displays an image of wiring patters on the surface of the printed circuit board 1 (a first layer) and in the internal layers (a second layer and a third layer) based on the image signals, as shown in FIG. 3.

Figure 3:
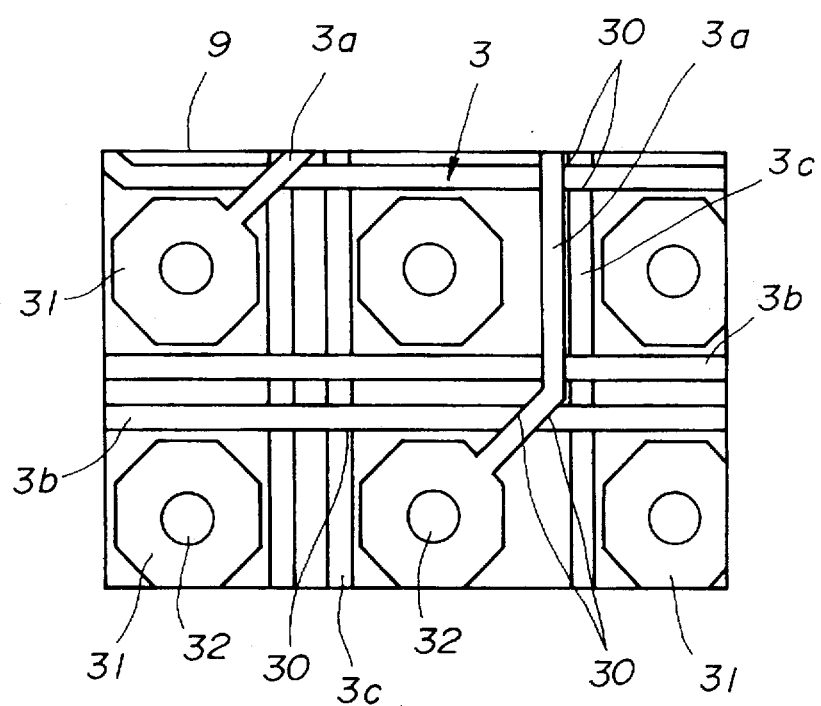
FIG. 3 is a diagram illustrating an image of wiring patterns which image is obtained by the apparatus shown in FIG. 2.

Referring to FIG. 3, the image includes via-pads 31 arranged in the first layer of the printed circuit board 1 and wiring lines 3a connected to the via-pads 31. Via-holes 32 are formed on the via-pads 31. The image displayed by the display unit 9 further includes wiring lines 3b in the second layer under the first layer and wiring lines 3c in the third layer under the second layer. In each layer, the wiring lines form a wiring pattern.

The first light 2a and the second light 2b (having the wave length within the infrared range) enters the printed circuit board 1 and are projected on the via-pads 31 and the wiring lines 3a, 3b and 3c in the respective layers at the predetermined incident angle Θ. For example, the light (the first light 2a or the second light 2b) is projected on a wiring line 3a in a direction parallel to the width direction of the wiring line 3a. In this case, in a portion in which the wiring line 3a in the first layer and a wiring line 3b in the second layer are overlapped, the shadow 30 of an edge of the wiring line 3a is projected on the wiring line 3b. Thus, a person who looks at the image displayed by the display unit 9 can determine, based on the shadow 30, which wiring line 3a or 3b is located at an upper position in the printed circuit board 1. In addition, the light is projected on the wiring line 3b in a direction parallel to the width direction of the wiring line 3b in the same manner as in the above case. In this case, in a portion in which the wiring line 3b in the second layer and a wiring line 3c in the third layer are overlapped, the shadow of an edge of the wiring line 3b is projected on the wiring line 3c. Thus, the person who looks at the image displayed by the display unit 9 can determine which wiring line 3b or 3c is located at an upper position.

As has been described above, to form the shadow of an upper wiring line on a lower wiring line so that the upper wiring line and the lower wiring line are clearly distinguished from each other, it is preferable that the light (the infrared) is projected on the upper wiring line in the direction parallel to the width direction of the upper wiring line. Thus, light sources may be located over four corners of the printed circuit board 1, and a plurality of light sources may be located over the printed circuit board 1 so as to be in a ring-shaped state.

Figure 7:
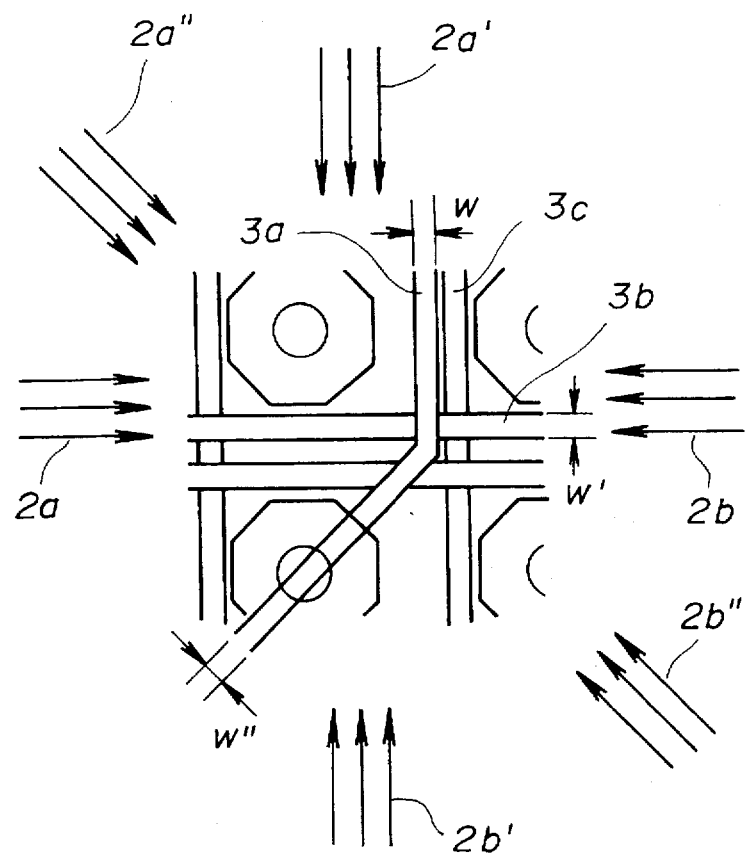
FIG. 7 is a diagram illustrating directions in which light is projected and an image of wiring patterns which image is obtained by the apparatus emitting the light to observe the wiring patterns.

In a case where the light is projected on the upper wiring line from one edge side thereof, the shadow of the upper wiring line may make the opposite edge of the upper wiring line indistinct. In such a case, the direction in which the light is incident on the printed circuit board 1 is changed as shown in FIG. 7. Referring to FIG. 7, first, the light 2a is projected on the wiring lines 3a, 3b and 3c in a direction parallel to the width direction of the wiring pattern 3a, so that a position of one edge of the wiring line 3a can be detected. Next, the direction in which the light is incident on the printed circuit board 1 is changed so that the light 2b is projected on the wiring lines 3a, 3b and 3c in a direction opposite to the direction of the light 2a. Since the opposite edge of the wiring line 3a is lit by the light 2b, a position of the opposite edge of the wiring line 3a can be detected. Thus, the width w of the wiring line 3a can be accurately measured.

In the same manner as in the above case, to measure the width w' of the wiring line 3b, the light projected on the wiring lines 3a, 3b and 3c is changed from the light 2a' to the light 2b'. Further, to measure width w" of the wiring line 3a, the light projected on the wiring lines 3a, 3b and 3c is changed from the light 2a" to the light 2b".

Figure 5:
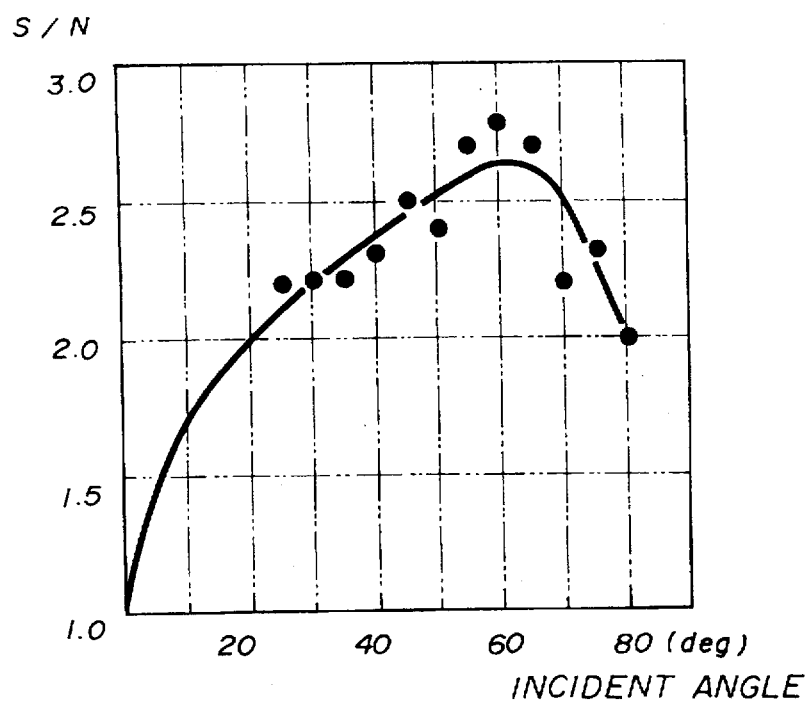
FIG. 5 is a diagram illustrating a characteristic between an angle at which light is projected on a printed circuit board and an S/N ratio of a detected image.

In the above embodiment, the amount of light which can enter the insulating layer (e.g., a polyimide layer) of the printed circuit board 1 depends on the incident angle Θ of the light incident on the printed circuit board 1. That is, an S/N ratio of the image displayed by the display unit 9 depends on the incident angle Θ of the light. The S/N ratio is defined by a difference between the densities of potions of the insulating layer and the wiring lines in the image displayed by the display unit 9. A relationship between the incident angle of the light incident on a polyimide insulating layer and the S/N ratio was experimentally obtained as shown in FIG. 5. According to this relationship, the incident angle Θ should be set at an angle within a range of 15 degrees to 80 degrees, preferably at about 60 degrees. To decide a value of the incident angle Θ of the light, material and the thickness of the insulating layer are taken into account.

An additional filters may be provided in optical paths in which the first light 2a and the second light 2b travel in order to reduce the interference between the light components having a wave length in the infrared range and other light components including the ultraviolet and visible light.

A description will now be given, with reference to FIG. 6, a modification of the embodiment described above.

Figure 6:
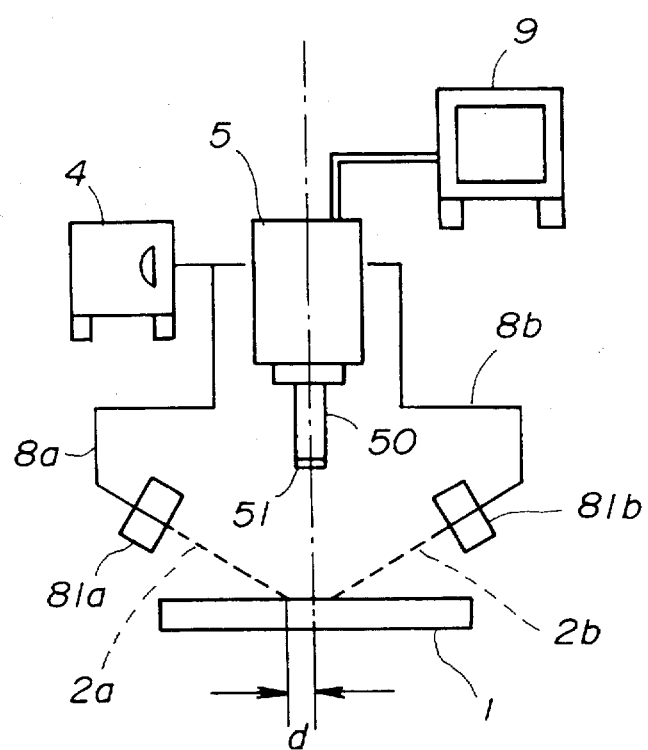
FIG. 6 is a diagram illustrating a modification of the apparatus shown in FIG. 2.

Referring to FIG. 6, the condenser lenses 81a and 81b are located so that points on which the first light 2a and the second light 2b from the condenser lenses 81a and 81b are projected are shifted by "d" from the target point at which the wiring patterns should be observed. This structure prevents light total reflected by the surface of the printed circuit board 1 from interfering the reflected light from the wiring patterns in the printed circuit board 1. Thus, the S/N ratio of the image displayed by the display unit 9 can be improved.

A description will now be given, with reference to FIG. 8, of a wiring pattern processing machine using the apparatus for observing wiring patterns in a printed circuit board.

Figure 8:
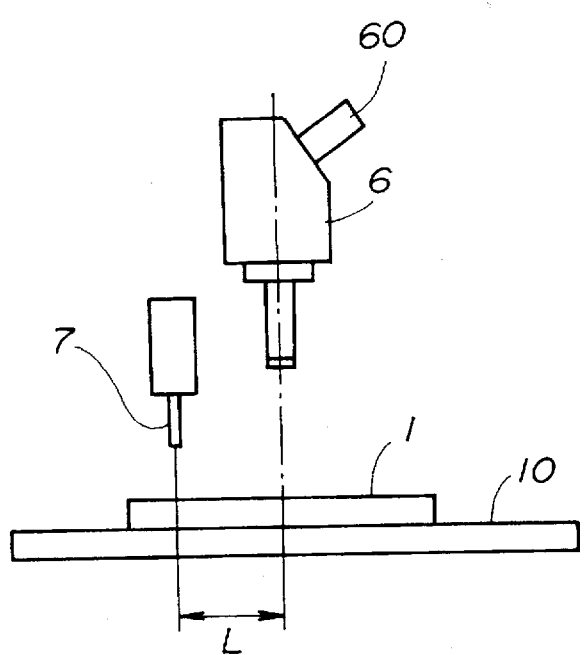
FIG. 8 is a diagram illustrating a machine which processes wiring patterns of a printed circuit board using the apparatus according to the present invention.

The machine shown in FIG. 8 is used to cut wiring lines on and/or in a printed circuit board so that wiring patterns are repaired. In addition, the machine may be used to remove conductive impurities which contribute to short-circuit of wiring patterns from an insulating layer.

Referring to FIG. 8, the machine has an observing apparatus 6, a cutting tool 7 and an X-Y table. A printed circuit board 1 to be processed is mounted on the X-Y table which is driven in X and Y directions by a driving unit (not shown). The observing apparatus 6 makes an image of a portion at the target point on the printed circuit board 1 using the light having a wave length in the infrared range in accordance with the method as described above. The observing apparatus 6 has a viewing window 60.

First, an operator operates the driving unit for the X-Y table 10 while observing the wiring patterns of the printed circuit board 1 (see FIG. 3) through the viewing window 60 so that a target point of the printed circuit board 1 to be processed is located just below the observing apparatus 6. Next, the X-Y table 10 is moved by a distance L which is an interval between the observing apparatus 6 and the cutting tool 7. As a result, the target point of the printed circuit board 1 to be processed is located just below the cutting tool 7. In this state, the operator operates the cutting tool 7 so that a wiring line at the target point is cut.

As the cutting tool 7, a mechanical unit, such as a cutter machine and a drill machine, and a laser unit may be used.

What is claimed is:

1. A method for observing wiring patterns of a printed circuit board, said method comprising the steps of:
   (a) projecting light having a wave length within an infrared range on the printed circuit board, the light is projected on a wiring line included in the wiring patterns in a direction parallel to a width direction of the wiring line;
   (b) detecting reflected light from the printed circuit board; and
   (c) forming an image based on the reflected light detected in said step (b), so that the wiring patterns of the printed circuit board are observed based upon the image of the reflected light.

2. The method as claimed in claim 1 further comparing a step of:
   (d) eliminating a light component having a wave length in an ultraviolet range and a visible light component from the light projected on the printed circuit board.

3. The method as claimed in claim 1 further comprising a step of:
   (e) eliminating a light component having a wave length in an ultraviolet range and a visible light component from the reflected light from the printed circuit board.

4. The method as claimed in claim 1, wherein a point on which the light is projected on the printed circuit board in said step (a) is separated from a target point of the printed circuit board to be observed, the target point being a point of a portion corresponding to the image formed in said step (c).

5. The method as claimed in claim 1, wherein the light projected on the printed circuit board includes first light in the infrared range and second light in the infrared range which are simultaneously projected on the wiring line from both edge sides of the wiring line.

6. The method as claimed in claim 1, wherein the light projected on the printed circuit board includes first and second light and said step (a) has steps of:
   (a-1) projecting the first light in the infrared range on the wiring line from one edge side of the wiring line; and
   (a-2) projecting the second light in the infrared range on the wiring line from an opposite edge side of the wiring line, wherein said step (b) has steps of:
   (b-1) detecting first reflected light from the printed circuit board when the first light is projected based on the wiring line in said step (a-1); and
   (b-2) detecting second reflected light from the printed circuit board when the second light is projected on the wiring line in said step (a-2), and wherein said step (c) has steps of:
   (c-1) forming a first image based on the first reflected light detected by said step (b-1), so that a first position of one edge of the wiring line is detected based on the first image; and
   (c-2) forming a second image based on the second reflected light detected by said step (b-2), so that a second position of an opposite edge of the wiring line is detected based on the second image, width of the wiring line being obtained from the first position and the second position detected in said steps (c-1) and (c-2).

7. A method as claimed in claims 1, wherein said step of detecting reflected light includes detecting light reflected on a surface of the printed circuit board and detecting light reflected from an internal layer of the printed circuit board.

8. An apparatus for observing wiring patterns of a printed circuit board, said apparatus comprising:

lighting means for projecting light having a wave length within an infrared range on the printed circuit board, the light is projected on a wiring line included in the wiring patterns in a direction parallel to a width direction of the wiring line;

detecting means for detecting reflected light from the printed circuit board; and image forming means for forming an image based on the reflected light detected by said detecting means, so that the wiring patterns of the printed circuit board are observed based upon the image of the reflected light.

9. The apparatus as claimed in claim 8 further comparing:

filter means for eliminating a light component having a wave length in an ultraviolet range and a visible light component from the reflected light from the printed circuit board.

10. The apparatus as claimed in claim 8, wherein a point on which the light is projected on the printed circuit board is separated from a target point of the printed circuit board to be observed, the target point being a point of a portion corresponding to the image formed by said image forming means.

11. The apparatus as claimed in claim 8, wherein said detecting means detects light reflected from a surface of the printed circuit board and detects light reflected from an internal layer of the printed circuit board.

12. The apparatus as claimed in claim 8, wherein said lighting means has first means for projecting first light in the infrared range on the wiring light from one edge side of the wiring line and a second means for projecting second light in the infrared rage on the wiring line from an opposite edge side of the wiring line.

* * * * *